United States Patent
Zhang et al.

[11] Patent Number: 6,104,067
[45] Date of Patent: *Aug. 15, 2000

[54] SEMICONDUCTOR DEVICE

[75] Inventors: Hongyong Zhang; Satoshi Teramoto, both of Kanagawa, Japan

[73] Assignee: Semiconductor Energy Laboratory Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/901,473

[22] Filed: Jul. 28, 1997

[30] Foreign Application Priority Data

Aug. 2, 1996 [JP] Japan ................................. 8-220677

[51] Int. Cl.[7] .................................................. H01L 31/119

[52] U.S. Cl. .............................................. 257/365

[58] Field of Search ............................... 257/365

[56] References Cited

U.S. PATENT DOCUMENTS

| | | |
|---|---|---|
| 4,158,807 | 6/1979 | Senturia . |
| 5,528,065 | 6/1996 | Battersby et al. . |
| 5,650,636 | 7/1997 | Takemura et al. . |

FOREIGN PATENT DOCUMENTS

| | | |
|---|---|---|
| 516847 | 12/1992 | European Pat. Off. . |
| 5-44195 | 4/1987 | Japan . |
| 62-092370 | 4/1987 | Japan . |
| 4-10659 | 1/1992 | Japan . |

*Primary Examiner*—Stephen D. Meier
*Attorney, Agent, or Firm*—Fish & Richardson P.C.

[57] ABSTRACT

A semiconductor device comprising a structure in which a plurality of gate electrodes connected in common are arranged superposed on the active layer, wherein the widest gate electrode is located on the drain side. In this manner, local difference in electric field intensity applied to the channel region can be corrected to prevent a local degradation or breakdown from occurring.

21 Claims, 3 Drawing Sheets

6,104,067

SEMICONDUCTOR DEVICE

BACKGROUND OF THE INVENTION

1. Field of the Invention

The present invention relates to a constitution of a thin film transistor having a high characteristics and reliability.

2. Description of the Related Art

Various devices employing thin film transistors are known. However, since the crystallinity of the silicon film constituting the active layer of a thin film transistor is insufficiently low, a large number of carriers are caused to move by the high electric field which is generated between the drain region and the channel region. This causes a problem of high OFF current. Furthermore, the low crystallinity of the silicon film can effect a low withstand voltage, and this causes serious degradation of the device.

As a means for solving the above problems, JP-B-5-44195 (the term "JP-B-" as used herein signifies "an examined published Japanese patent application") discloses a constitution comprising a plurality of equivalent thin film transistors being connected in a serial arrangement so as to lower the voltage applied to each of the thin film transistors.

However, when a device of the above constitution described in JP-B-5-44195 is manufactured and operated, it has been found that a high voltage is applied locally to the thin film transistor on the drain side. That is, in the constitution above, it has been found that the voltage is not distributed equally to each of the thin film transistors, but that the thin film transistor on the drain side alone is subjected to high voltage.

Moreover, when operated under a high voltage, it has also been found that the breakdown or degradation occurs in sequence from the thin film transistor on the drain side.

SUMMARY OF THE INVENTION

An object of the present invention is, accordingly, to provide a means for solving the aforementioned problems of breakdown and degradation that occur in case a plurality of thin film transistors are serially connected in an equivalent arrangement, which is due to the high voltage that generates locally to a part of the plurality of thin film transistors.

According to a constitution of the present invention, there is provided a semiconductor device comprising a plurality of gate electrodes connected in common and superposed on the active layer, wherein the widest gate electrode is located on the drain side.

In accordance with another constitution of the present invention, there is provided a semiconductor device comprising that it comprises a structure in which three or more gate electrodes connected to a common electrical potential and superposed on the active layer, wherein the widest gate electrodes are located on the source and the drain sides.

Also according to another constitution of the present invention, there is provided a semiconductor device characterized in that it comprises a structure in which a plurality of gate electrodes connected in common are arranged superposed on the active layer, wherein the gate electrodes differs from each other in width.

Furthermore, a constitution having an LDD region or an offset gate region may be combined with the constitution according to the present invention. Additionally, the present invention can be used in either a top-gate type comprising the gate electrode over the active layer (as viewed from the substrate side) or a bottom-gate type comprising the gate electrode under the active layer.

DETAILED DESCRIPTION OF THE INVENTION

Figure 1:
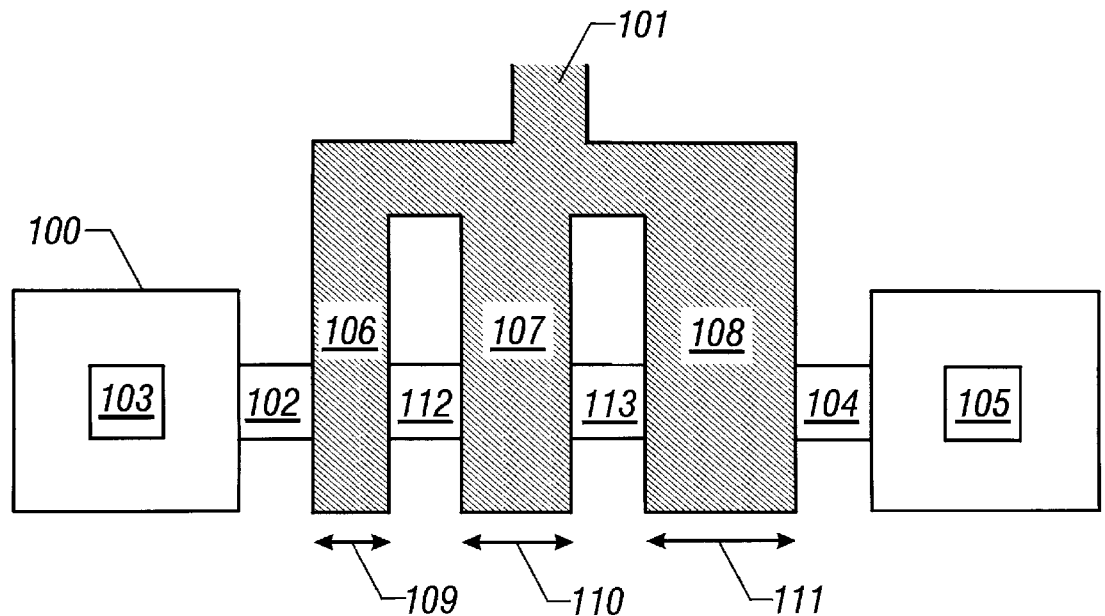
FIG. 1 is a schematic drawing showing a constitution comprising a plurality of equivalently connected thin film transistors.

Referring to FIG. 1, a constitution according to the present invention comprises a plurality of gate electrodes 106, 107, and 108 each having a width of 109, 110, and 111, respectively, and each superposed on an active layer 100. It can be seen from the widths 109, 110, and 111 that the gate electrodes increase their width with approaching the side on which drain region 104 is located.

Thus, the electric field of the channel region on the side of the drain region 104, where the highest voltage is applied, can be relaxed in this manner. That is, the difference in the intensity of the electric field at the channel region that is formed in the active layer under each of the gate electrodes can be corrected by employing this constitution.

Furthermore, the degradation or the breakdown that proceeds from the portion of the channel region on the drain region side can be suppressed in this manner.

The present invention is described in detail below referring to non-limited examples.

Embodiment 1

FIG. 1 shows a constitution according to the present invention, in which three thin film transistors are connected equivalently in series.

Referring to FIG. 1, a gate electrode 101 is superposed on an active layer 100 by three portions 106, 107, and 108.

Thus, channels are formed in the active layer 100 at portions where the gate electrode patterns 106, 107, and 108 are superposed. The region where a channel is formed is intrinsic (I-type), or substantially intrinsic.

The regions 102, 112, 113, and 104 in the active layer 100 are each doped with P (phosphorus), and exhibit N-type conductivity. The region 102 is the source region, and the region 104 is the drain region. Regions 103 and 105 are each a source contact portion and a drain contact portion, respectively.

The constitution according to the present example is characterized in that the patterns 106, 107, and 108, which function as gate electrodes, differ from each other in pattern width. More specifically, the size of the patterns is different as is shown by widths 109, 110, and 111.

In the present invention, the greatest width is indicated by 111. This constitution is employed based on the observed fact that, in case a plurality of thin film transistors are serially connected in an equivalent manner, a highest voltage is applied to the thin film transistor located on the side of the drain.

By employing the constitution above, the intensity of the electric field in the channel region under each of the gate electrodes can be controlled to yield the same (or approximately the same) value, thereby preventing breakdown or degradation from occurring on a particular portion.

Embodiment 2

Figure 2:
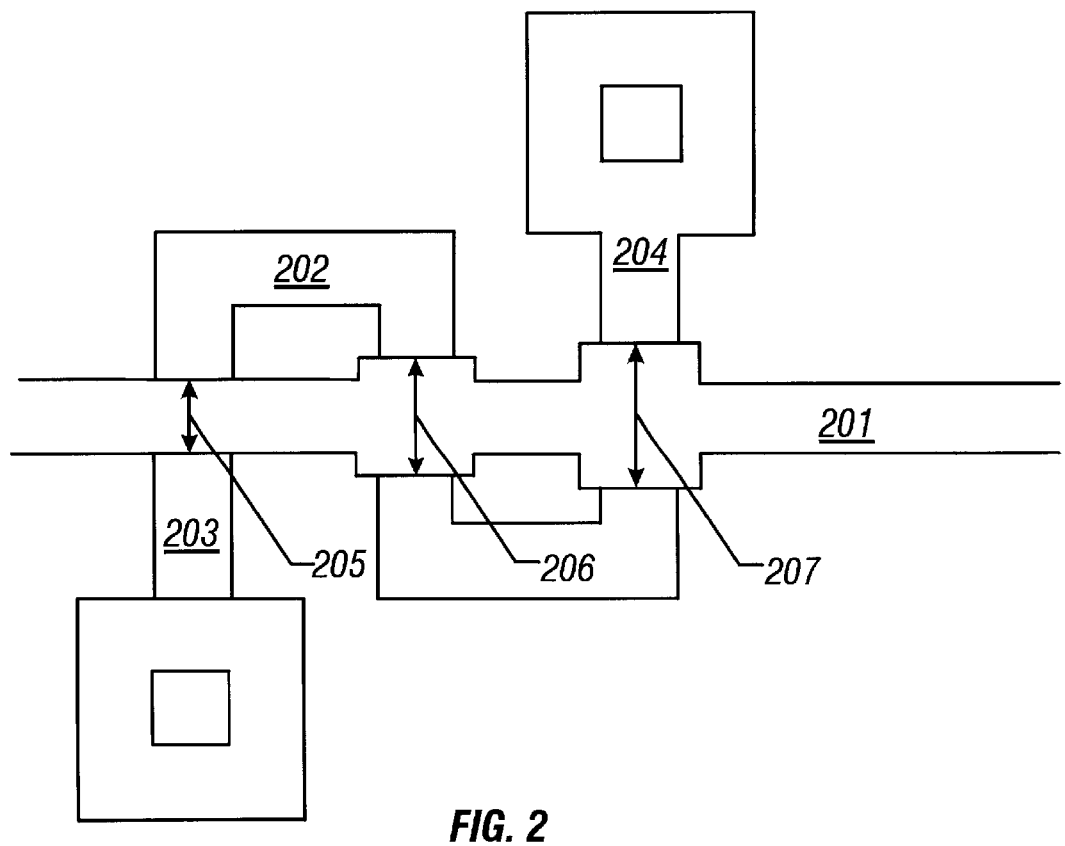
FIG. 2 is a schematic drawing showing a constitution comprising a plurality of equivalently connected thin film transistors.

A scheme of the present example is shown in FIG. 2. Referring to FIG. 2, the constitution of the present example is characterized in that the width of the gate line 201 corresponding to the crossing with an active layer is partially widened. Thus, the width of the channels corresponding to each of the thin film transistors is differed in this manner.

Referring to FIG. 2, the width of the gate electrode is sequentially increased from that corresponding to the one located on the side of the source region 203 to that of the electrode provided on the side of the drain region, 204 as is shown by 205, 206, and 207. Thus, in this manner, the corresponding channel length is sequentially increased to correct for the difference in electric field inside the channel.

Embodiment 3

The present invention can be applied to a liquid crystal display panel of an active matrix type. In particular, it can be used in peripheral drive circuits in which a high voltage is required. Examples of devices using an active-matrix type liquid crystal panel are given below.

Images can be displayed on liquid crystal panels by either irradiating light from a back light, or by reflecting an external light which is called reflecting type. The constitution according to the present invention can be used in either type.

Figure 3A:
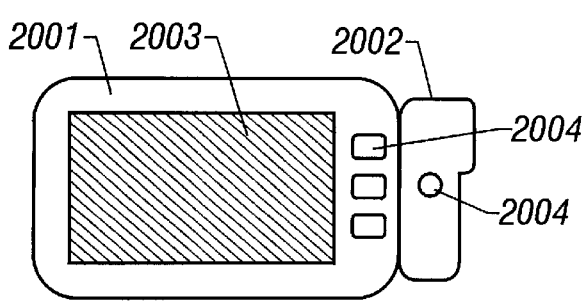
FIGS. 3A to 3E are schematic drawings of the devices using the present invention.

FIG. 3A shows a photographing device such as a digital still camera, an electronic camera, or a video movie capable of handling a motion picture.

The device electronically stores an image photographed by a CCD camera (or a proper photographing means) provided to a camera body 2002. The thus photographed image is displayed on a liquid crystal display panel 2003 provided to the body 2001. The device is operated by means of operation buttons 2004.

Figure 3B:
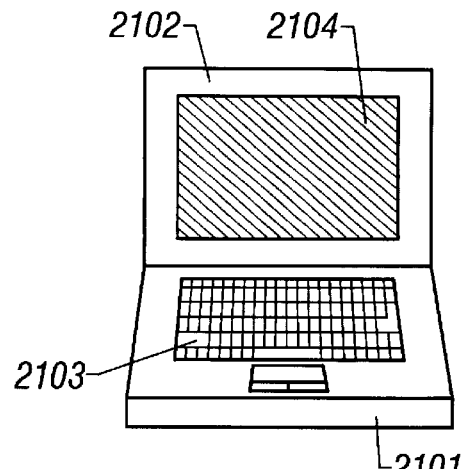

FIG. 3B shows a portable personal computer (information processing device). The device comprises a liquid crystal display panel 2104 with a freely openable cover (lid) 2102, and information is input or a variety of arithmetic operations are made by using a keyboard 2103.

Figure 3C:
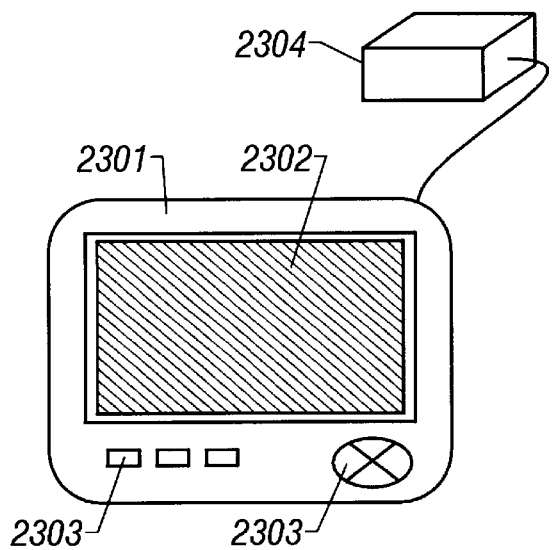

FIG. 3C shows a car navigation system (information processing device) equipped with a flat panel display. The car navigation system comprises an antenna portion 2304 and a main body having a liquid crystal display panel 2302.

Various types of information necessary for the navigation are switched by operation buttons 2303. In general, a remote control device (not shown) is used for the operation.

Figure 3D:
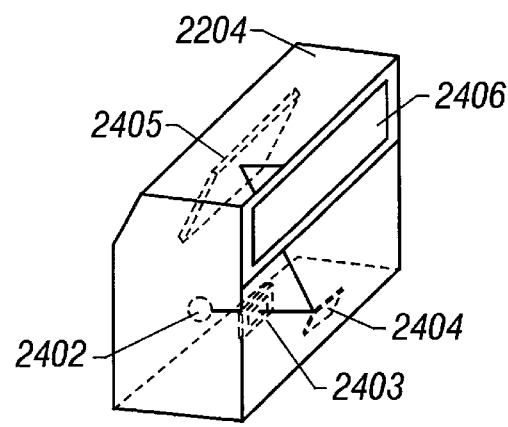

FIG. 3D shows an example of a projection type image display device. In the figure, the light emitted from a light source 2402 is optically modulated by a liquid crystal display panel to provide an image. The image is projected on a screen 2406 after it is reflected by mirrors 2404 and 2405.

Figure 3E:
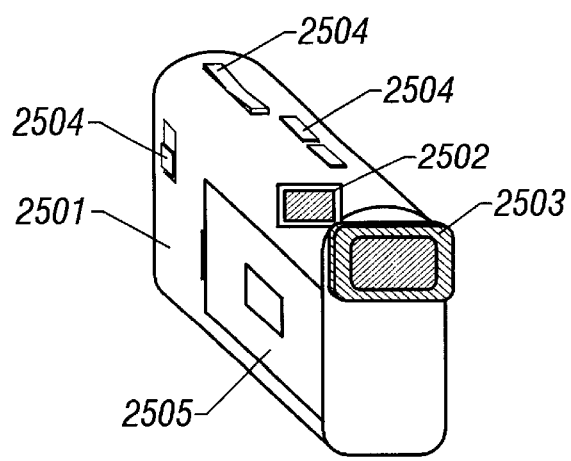

FIG. 3E shows a main body of a video camera (photographing device) equipped with a display device known as a "view finder". A view finder comprises, roughly, a liquid crystal display panel 2502 and an eye piece 2503 on which the image is displayed.

Referring to FIG. 3E, the video camera is operated by operation buttons 2504, and the image is recorded on a magnetic tape stored inside a tape holder 2505. The image photographed by a camera (not shown) is displayed on the liquid crystal display panel 2502. The display panel 2502 also displays the image recorded on a magnetic tape.

Embodiment 4

The present invention refers to a modification of a constitution with reference to Example 2 as is shown in FIG. 2. The constitution shown in FIG. 2 comprises a path from a source to a drain and another different path from a drain to a source. Accordingly, in case the polarity of the supplied signal voltage is inverted, there is a problem that the symmetry of the operation is lost.

Figure 4:
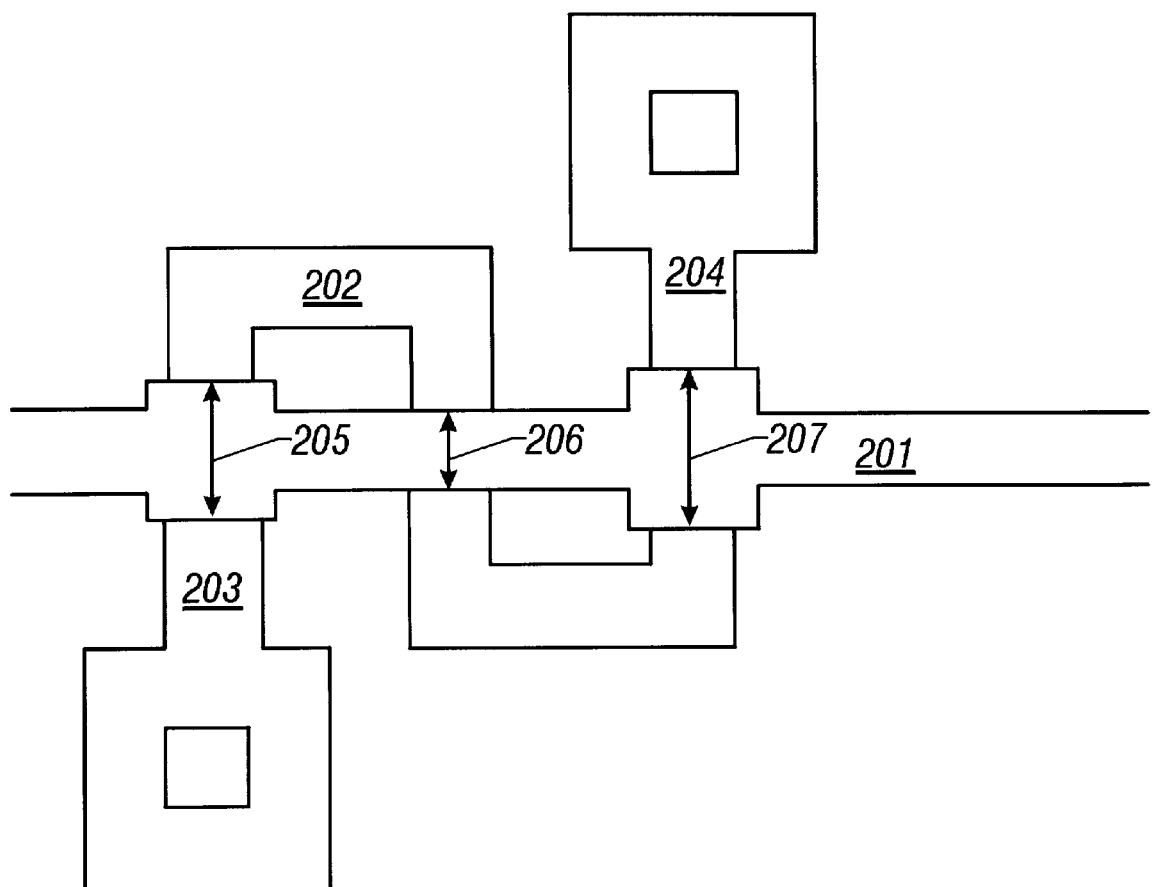
FIG. 4 is a schematic drawing showing a constitution comprising a plurality of equivalently connected thin film transistors.

Thus, as is shown in FIG. 4, in the present example, the width 205 of the gate electrode on the source region side and that 207 of the gate electrode on the drain region side are provided the same, but wider than that 206 of the gate electrode located at the center.

In this manner, the path (through which the carriers move) from the source region 203 to the drain region 204 can be provided the same as that from the drain region 204 to the source region 203. Thus, the symmetry of the operation can be maintained even in case the polarity of the signal voltage that is supplied between the source and the drain is inverted.

By thus utilizing the present invention on a constitution comprising a plurality of thin film transistors being serially connected in an equivalent arrangement as is described above, the problem of breakdown and degradation can be solved in case a high voltage is applied to a part of the thin film transistors.

While the invention has been described in detail, it should be understood that the present invention is not to be construed as being limited thereto, and that any modifications can be made without departing from the scope of claims.

What is claimed is:

1. A semiconductor device comprising:

a substrate;

an active layer including a source region and a drain region; and a plurality of gate electrodes disposed adjacent to said active layer and connected to a common electrical potential; and a plurality of channel regions formed in said active layer in association with said gate electrodes, wherein an impurity doped region having a same conductivity as said source and drain regions is formed between said plurality of channel regions, wherein each of said gate electrodes has a width in a direction along a carrier flow direction through the associated channel region, and the gate electrode nearest to said drain region has a largest width, and wherein said plurality of gate electrodes and said active layer constitute a plurality of thin film transistors connected serially.

2. A semiconductor device according to claim 1 wherein said plurality of gate electrodes are located over said active layer in a direction as would be viewed from said substrate.

3. A semiconductor device according to claim 1 wherein said plurality of gate electrodes are located under said active layer in a direction as would be viewed from said substrate.

4. A semiconductor device according to claim 1 wherein said semiconductor device is for use in a liquid crystal display panel constituting one of a photographing device, a portable personal computer, a car navigation system and a projection type image display device.

5. A semiconductor device comprising:

a substrate;

an active layer including a source region and a drain region;

at least first, second and third gate electrodes adjacent to said active layer, said gate electrodes being connected to a same electrical potential, said first gate electrode being nearest to said source region and said third gate electrode being nearest to said drain region; and at least three channel regions in said active layer in association with said gate electrodes, wherein an impurity doped region having a same conductivity type as said source and drain regions is formed between said channel regions, wherein each of said gate electrodes has a width in a direction along a carrier flow direction through the associated channel region, and the widths of said first and third gate electrodes are larger than the width of said second gate electrode, and wherein said first, second and third gate electrodes and said active layer constitute at least three thin film transistors connected serially.

6. A semiconductor device according to claim 5 wherein the width of said first gate electrode is equal to the width of said third gate electrode.

7. A semiconductor device according to claim 5 wherein said first, second and third gate electrodes are located over said active layer in a direction as would be viewed from said substrate.

8. A semiconductor device according to claim 5 wherein said first, second and third gate electrodes are located under said active layer in a direction as would be viewed from said substrate.

9. A semiconductor device according to claim 5 wherein said semiconductor device is for use in a liquid crystal display panel constituting one of a photographing device, a portable personal computer, a car navigation system and a projection type image display device.

10. A semiconductor device comprising:

a substrate;

an active layer including a source region and a drain region;

a plurality of gate electrodes disposed adjacent to said active layer and connected to a same electrical potential; and a plurality of channel regions in said active layer in association with said gate electrodes, wherein an impurity doped region having a same conductivity type as said source and drain regions is formed between said plurality of channel regions, wherein each of said gate electrodes has a different width in a direction along a carrier flow direction through the associated channel region, and at least one gate electrode nearest to either one of said source and drain regions has a largest width relative to others, and wherein said plurality of gate electrodes and said active layer constitute a plurality of thin film transistors connected serially.

11. A semiconductor device according to claim 10 wherein said plurality of gate electrodes are located over said active layer in a direction as would be viewed from said substrate.

12. A semiconductor device according to claim 10 wherein said plurality of gate electrodes are located under said active layer in a direction as would be viewed from said substrate.

13. A semiconductor device according to claim 10 wherein said semiconductor device is for use in a liquid crystal display panel constituting one of a photographing device, a portable personal computer, a car navigation system and a projection type image display device.

14. A semiconductor device comprising:

a substrate;

an active layer including a source region and a drain region;

at least first and second gate electrodes disposed adjacent to said active layer and connected to a common electrical potential; and at least first and second channel regions formed in said active layer adjacent to said first and second gate electrodes, wherein an impurity doped region having a same conductivity as said source region and said drain region is formed between said first and second channel regions, wherein each of said first and second gate electrodes has a width in a direction along a carrier flow direction through said first and second channel regions, and the width of said first gate electrode is different from the width of the second gate electrode, and wherein said first and second gate electrodes and said active layer constitute at least two thin film transistors connected serially.

15. A semiconductor device according to claim 14 wherein said first and second gate electrodes are located over said active layer in a direction as would be viewed from said substrate.

16. A semiconductor device according to claim 14 wherein said first and second gate electrodes are located under said active layer in a direction as would be viewed from said substrate.

17. A semiconductor device according to claim 14 wherein said semiconductor device is for use in a liquid crystal display panel constituting one of a photographing device, a portable personal computer, a car navigation system and a projection type image display device.

18. A semiconductor device comprising:

a substrate;

an active layer including a source region and a drain region, said active layer having a bending shape;

a gate line crossing with said active layer at a plurality of portions;

wherein a width of said gate line at one portion nearest to said drain region of said plurality of portions is wider than a width of said gate line at the other one of said portions, and wherein said active layer and said gate line constitute a plurality of thin film transistors connected serially.

19. A semiconductor device according to claim 18 wherein said gate line is located over said active layer as viewed from said substrate.

20. A semiconductor device according to claim 18 wherein said gate line is located under said active layer as viewed from said substrate.

21. A semiconductor device according to claim 18 wherein said semiconductor device is for use in a liquid crystal display panel constituting one of a photographing device, a portable personal computer, a car navigation system and a projection type image display device.

* * * * *